United States Patent
Segan et al.

(10) Patent No.: US 9,070,684 B2
(45) Date of Patent: Jun. 30, 2015

(54) INTEGRATED CIRCUIT POWER GRID WITH IMPROVED ROUTING RESOURCES AND BYPASS CAPACITANCE

(75) Inventors: Scott A. Segan, Allentown, PA (US); Scott T. Van Horn, Shenandoah, PA (US); Gary E. Hall, Danielsville, PA (US); Matthew J. Gehman, Bally, PA (US); Richard Muscavage, Gilbertsville, PA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 213 days.

(21) Appl. No.: 13/460,291

(22) Filed: Apr. 30, 2012

(65) Prior Publication Data

US 2013/0285219 A1    Oct. 31, 2013

(51) Int. Cl.
| | | |
|---|---|---|
| H01L 27/10 | (2006.01) |
| H01L 23/52 | (2006.01) |
| H01L 23/522 | (2006.01) |
| H01L 23/528 | (2006.01) |

(52) U.S. Cl.
CPC ........ *H01L 23/5223* (2013.01); *H01L 23/5283* (2013.01); *H01L 23/5286* (2013.01); *H01L 2924/0002* (2013.01)

(58) Field of Classification Search
CPC ............ H01L 23/5223; H01L 23/5283; H01L 23/5286; H01L 2027/11881
USPC .................. 257/207, 208, 210, 211, 691, 773
See application file for complete search history.

(56) References Cited

U.S. PATENT DOCUMENTS

| 6,147,857 A | 11/2000 | Worley et al. |
| 6,483,176 B2 * | 11/2002 | Noguchi et al. ............ 257/666 |

* cited by examiner

Primary Examiner — Hung Vu
(74) Attorney, Agent, or Firm — Suiter Swantz pc llo

(57) ABSTRACT

An integrated circuit power grid is provided with improved routing resources and bypass capacitance. A power grid for an integrated circuit comprises a plurality of thick metal layers having a plurality of metal traces, wherein at least one of the thick metal layers has a lower pitch than a substantial maximum pitch allowed under the design rules for a given integrated circuit fabrication technology. A power grid for an integrated circuit can also comprise a plurality of thin metal layers having a plurality of metal traces, wherein a plurality of the metal traces on different thin metal layers are connected by at least one via, wherein the at least one via is substantially surrounded by a metal trace on at least one thin metal level connected to a different power supply voltage than a power supply of one or more additional thin metal levels. The via can be positioned, for example, at an intersection of a given standard cell row and a given vertical strap.

22 Claims, 8 Drawing Sheets

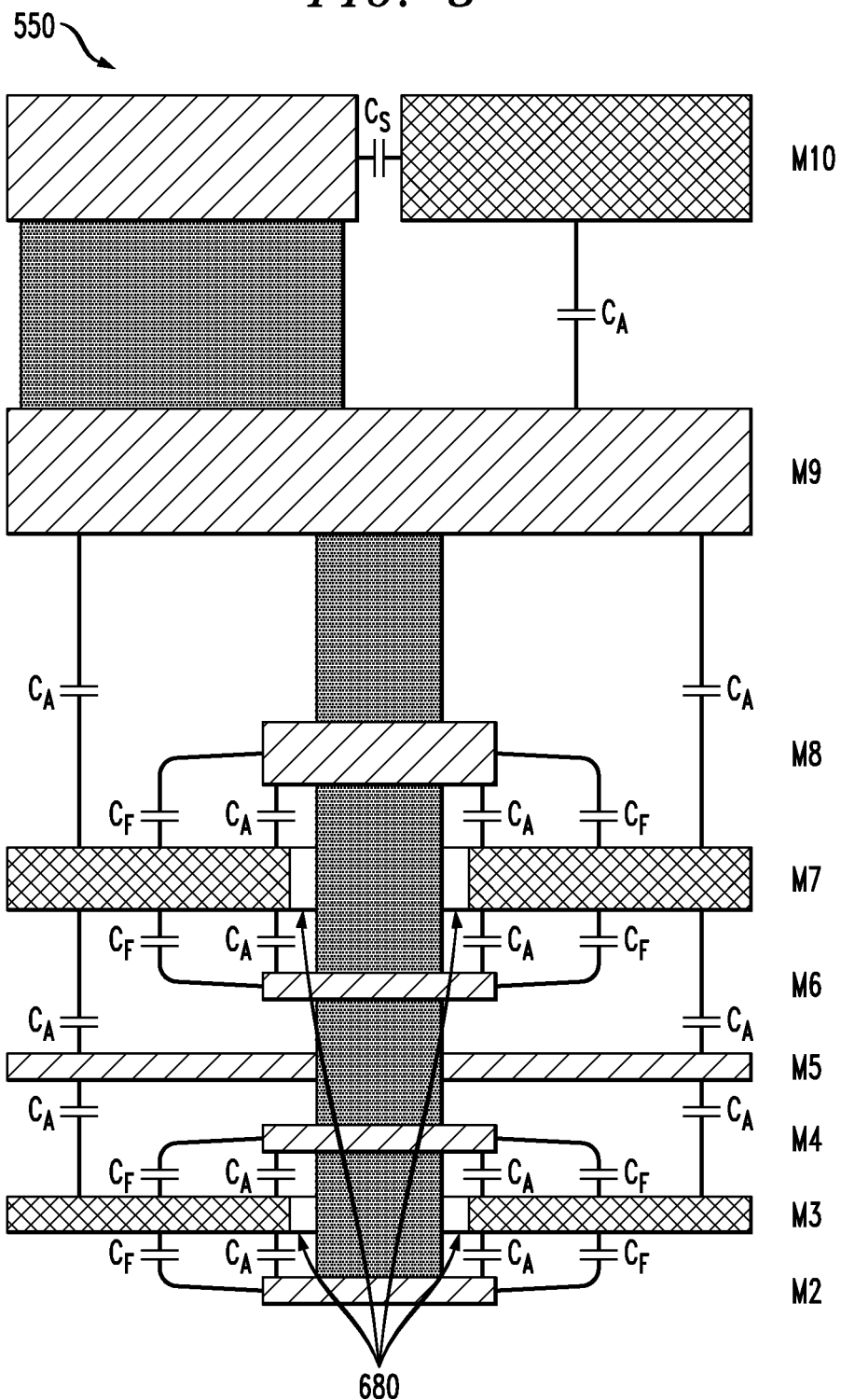

INTEGRATED CIRCUIT POWER GRID WITH IMPROVED ROUTING RESOURCES AND BYPASS CAPACITANCE

BACKGROUND

Electrical power is distributed to components of an integrated circuit (IC) over a network of conductors, often referred to as a power grid. The power grid distributes power supply voltages from bond pad locations to the various transistors on the integrated circuit through metal traces formed in one or more layers. The metal traces used to route power supply voltages through an integrated circuit have resistance. Thus, there is typically a voltage drop across the power grid, typically referred to as an IR drop, due to the resistance of the metal traces of the power grid. The voltage seen at the component devices is therefore the power supply voltage less the IR drop and possibly additional loss factors.

Excessive voltage drops in the power grid may impair functionality of the integrated circuit. A number of techniques have been proposed or suggested for alleviating IR drop issues in power grids for integrated circuits. For example, bypass capacitance can be added to the power grid structure to reduce the IR drop. The traditional approach for adding bypass capacitance to a power grid is to place bypass capacitor cells in the standard cell rows. This approach, however, requires cell area and the bypass capacitors are comprised of transistors that have a high ESR (equivalent series resistance) and a leakage power associated with them. Thus, the added transistors increase the overall power consumption of the integrated circuit.

A need therefore remains for improved techniques for alleviating IR drop issues in integrated circuit power grids. A further need exists for techniques to alleviate IR drop issues in power grids where the bypass capacitance is built directly into the power grid, while saving on routing resources.

SUMMARY

Generally, an integrated circuit power grid is provided with improved routing resources and bypass capacitance. According to one aspect of the invention, a power grid for an integrated circuit comprises a plurality of thick metal layers having a plurality of metal traces, wherein at least one of the thick metal layers has a lower pitch than a substantial maximum pitch allowed under the design rules for a given integrated circuit fabrication technology.

For example, the lower pitch can comprises a substantial minimum pitch that is allowed under the design rules for a given technology. In one exemplary implementation, at least one thick metal layer has a lower pitch than one or more additional thick metal layers. Generally, the pitch comprises a distance from one edge of a given metal trace to a corresponding edge of an adjacent metal trace. The lower pitch can increase a bypass capacitance of the power grid. The lower pitch can increase a number of transitions between at least two power supply levels in a given area.

According to another of the invention, a power grid for an integrated circuit comprises a plurality of thin metal layers having a plurality of metal traces, wherein a plurality of the metal traces on different thin metal layers are connected by at least one via, wherein the at least one via is substantially surrounded by a metal trace on at least one thin metal level connected to a different power supply voltage than a power supply of one or more additional thin metal levels. The via can be positioned, for example, at an intersection of a given standard cell row and a given vertical strap.

Generally, the different power supply voltage for the surrounding metal trace increases a number of $V_{DD}$ to $V_{SS}$ transitions in a given area; and/or increases an area capacitance, $C_A$, of the power grid. The disclosed power grid optionally further comprises a cutout of the surrounding metal trace. The cutout can be of the metal trace having an alternate power supply to a power supply voltage of the via. The cutout prevents a short circuit between two power supply voltages, and increases one or more of a fringe capacitance, $C_F$, and a sidewall capacitance, $C_S$, of the power grid.

A more complete understanding of the present invention, as well as further features and advantages of the present invention, will be obtained by reference to the following detailed description and drawings.

BRIEF DESCRIPTION OF THE DRAWINGS

FIGS. 7 and 8 are cross sectional views of the exemplary via along particular lines of FIG. 5.

DETAILED DESCRIPTION

Figure 1:
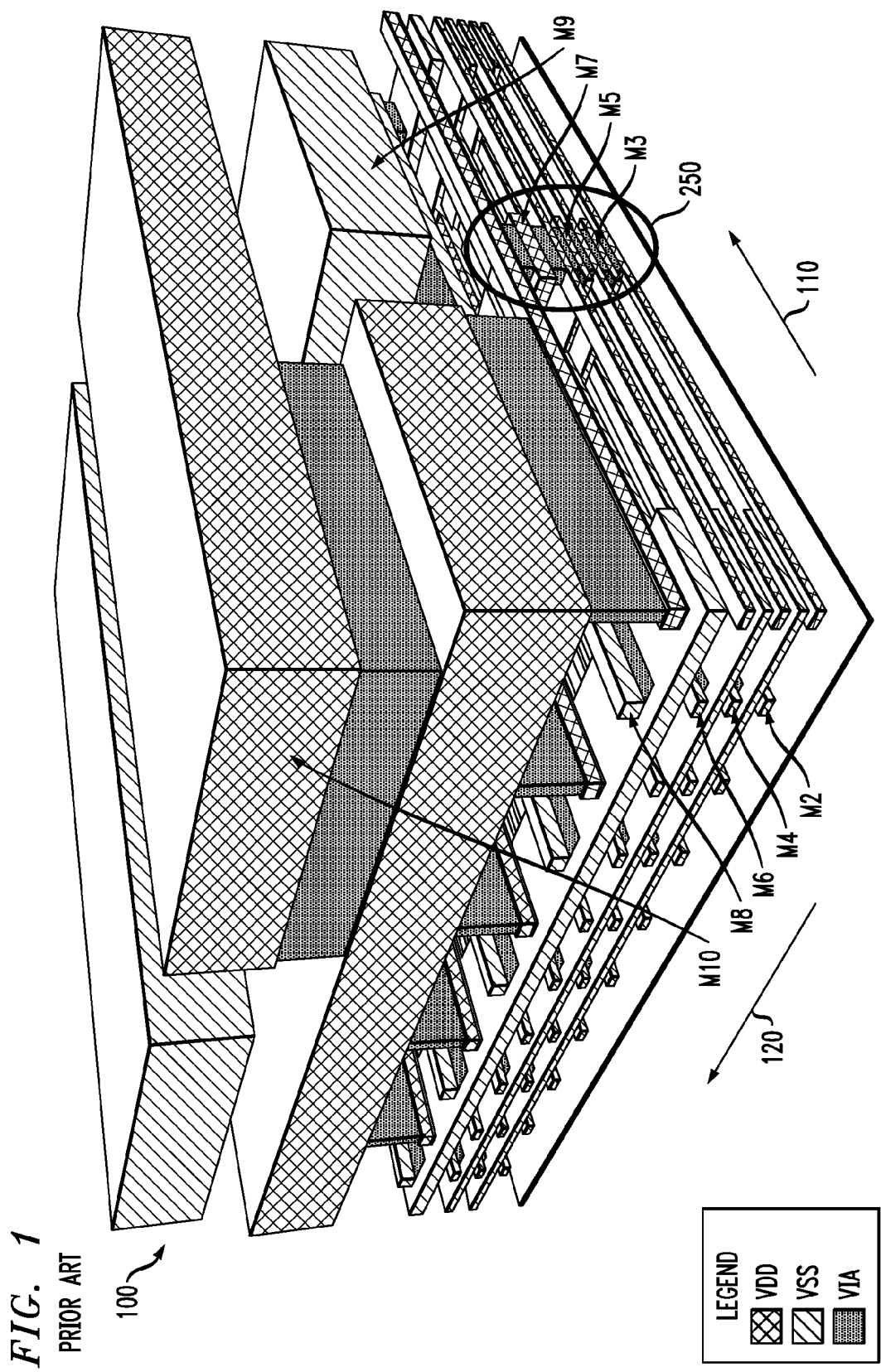
FIG. 1 illustrates a portion of an exemplary conventional power grid for an integrated circuit.

Aspects of the present invention provide an integrated circuit power grid with improved routing of power supply voltages and bypass capacitance. A multi-level power grid comprises thick metal levels and thin metal levels. In the exemplary embodiments described herein, the thick metal levels comprise levels M9 and M10 and the thin metal levels comprise levels M2-M8. As discussed herein, bypass capacitance comprises one or more of area capacitance, $C_A$, fringe capacitance, $C_F$, and sidewall capacitance, $C_S$. Among other benefits, the disclosed exemplary techniques do not require additional surface area, while also employing a low ESR bypass capacitor with substantially no leakage power.

According to one aspect of the invention, bypass capacitance is increased in the thick metal levels of the power grid by decreasing the pitch on at least one level. As used herein, the pitch comprises the distance from one edge of a metal trace to the corresponding edge of an adjacent metal trace. For example, the pitch comprises the distance from a logically left edge of a metal trace to the logically left edge of an adjacent metal trace. Thus, the pitch comprises the wire width of a given metal trace, as well as the space between the given metal trace and the adjacent metal trace. As discussed further below in conjunction with FIG. 1, conventional techniques employ the maximum pitch on the thick metal levels that is allowed under the design rules for a given technology. This aspect of the present invention recognizes that reducing the pitch increases the number of $V_{DD}$ to $V_{SS}$ transitions in a given area, thereby increasing the area capacitance, $C_A$, and sidewall capacitance, $C_S$. In one exemplary embodiment, at least one level among the thick metal levels employs a lower pitch than other thick metal levels. In one particular exemplary embodiment, at least one level among the thick metal levels employs a substantial minimum pitch that is allowed under the design rules for a given technology.

According to another aspect of the invention, bypass capacitance is increased in the thin metal levels of the power grid by employing a different power supply voltage at a given intersection (via) of a given standard cell row and a given vertical strap for at least one level among the thin metal levels than the other thin metal levels. As discussed further below in conjunction with FIGS. 2 and 3, conventional techniques employ the same power supply voltage at a given intersection (via) of a given standard cell row and a given vertical strap for all thin metal levels. For example, conventional techniques can employ a $V_{DD}$ power supply voltage at a given intersection (via) of a given standard cell row and a given vertical strap for all thin metal levels. This aspect of the present invention recognizes that employing a different power supply voltage for at least one thin metal level at a given intersection increases the number of $V_{DD}$ to $V_{SS}$ transitions in the vertical direction in a given area, thereby increasing the area capacitance, $C_A$.

In addition, as discussed further below, since the alternate power supply can be in the vicinity of a via on the thin metal levels, a further aspect of the invention provides cutouts in the metal traces having the alternate power supply to the via power supply, around the via, in order to prevent a short circuit between the two power supply voltages. Among other benefits, the cutouts increase the fringe capacitance, $C_F$, and sidewall capacitance, $C_S$. As discussed further below in conjunction with FIGS. 7 and 8, the sidewall capacitance, $C_S$. comes from the distance between the cutout and the via stack, while the fringe capacitance, $C_F$, comes from the metal around the cut out to the via stack.

FIG. 1 illustrates a portion of an exemplary conventional power grid 100 for an integrated circuit. As shown in FIG. 1, the exemplary conventional power grid 100 comprises a plurality of exemplary metal levels M2 through M10. As previously indicated, exemplary levels M9 and M10 are typically referred to as the thick metal levels and exemplary levels M2-M8 are typically referred to as the thin metal levels. As discussed hereinafter, each metal level M2 through M10 comprises $V_{DD}$ and/or $V_{SS}$ power straps. The various $V_{DD}$ power straps and $V_{SS}$ power straps are distinguished from one another in the figures using different hash patterns, as identified in the Legend portion of each figure. The $V_{DD}$ power straps on the various levels M2 through M10 are connected to the $V_{DD}$ power supply voltage using $V_{DD}$ via stacks, such as via stack 250, as discussed further below in conjunction with FIGS. 2 and 3. Likewise, the $V_{SS}$ power straps on the various levels M2 through M10 are connected to the $V_{SS}$ power supply voltage using $V_{SS}$ via stacks, as discussed further below in conjunction with FIG. 3.

As shown in FIG. 1, the $V_{DD}$ power straps and $V_{SS}$ power straps on levels M9 and M10 are interleaved to create a waffle pattern of $V_{DD}$ and $V_{SS}$ straps. As indicated above, conventional power grids 100 employ the maximum pitch on the thick metal levels, such as levels M9 and M10 for the exemplary conventional power grid 100, that is allowed under the design rules for a given technology. In addition, conventional power grids 100 employ a uniform pitch on all thick metal levels, such as levels M9 and M10 for the exemplary conventional power grid 100.

The exemplary conventional power grid 100 also comprises a plurality of thin metal levels M2 through M8, as discussed further below in conjunction with FIGS. 2 and 3. In addition, FIG. 1 also illustrates first and second directions 110, 120, respectively, of the exemplary conventional power grid 100. In the notation used herein, parallel standard cell rows run along the first direction 110 on even thin metal levels (M2, M4, M6 and M8) and parallel vertical straps run along the second direction 120 on odd thin metal levels (M3, M5 and M7). The metal traces on the thin metal levels M2-M8 are perpendicular to one another on odd and even levels.

Figure 2:
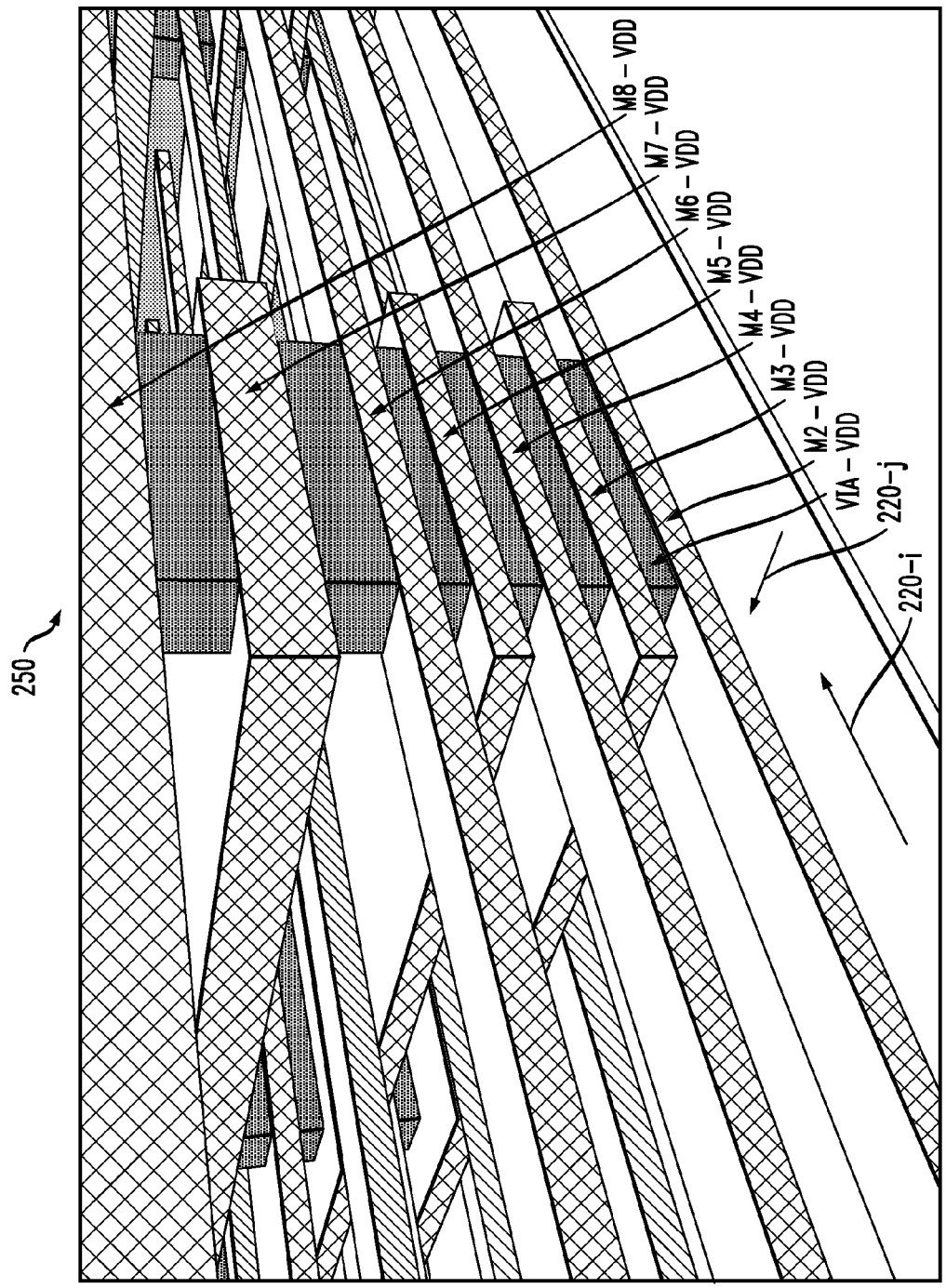
FIG. 2 illustrates a portion of the exemplary conventional power grid of FIG. 1 corresponding to the thin metal levels M2-M8 in further detail.

FIG. 2 illustrates a portion 200 of the exemplary conventional power rid 100 of FIG. 1 corresponding to the thin metal levels M2-M8 in further detail. The illustrated portion 200 shown in FIG. 2 corresponds to a given via stack 250, which is positioned at an intersection between a given standard cell row 210-$i$ and a given vertical strap 220-$j$. As indicated above, parallel standard cell rows run along the first direction 210 on even thin metal levels (M2, M4, M6 and M8) and parallel vertical straps run along the second direction 220 on odd thin metal levels (M3, M5 and M7). In addition, on each thin metal level, the metal traces alternate with $V_{DD}$ power straps and $V_{SS}$ power straps, as discussed further below in conjunction with FIG. 3. As shown in FIG. 2, conventional techniques thus employ the same power supply voltage at a given intersection (via) of a given standard cell row and a given vertical strap for all thin metal levels M2-M8. For example, as shown in FIG. 2, conventional techniques can employ a $V_{DD}$ power supply voltage at a given intersection (via) for all exemplary thin metal levels M2-M8. Thus, a given via stack 250 intersects with only one power supply voltage.

It is noted that the two vias (not shown in FIG. 2) that are adjacent to via stack 250 in each direction along the standard cell row 210-$i$ will have the alternate power supply voltage, relative to the power supply voltage associated with via stack 250, as discussed further below in conjunction with FIG. 3. For example, if via stack 250 is connected to a $V_{DD}$ power supply voltage, then the two vias (not shown) that are adjacent to via stack 250 in each direction along the standard cell row 210-$i$ will have a $V_{SS}$ power supply voltage.

Figure 3:
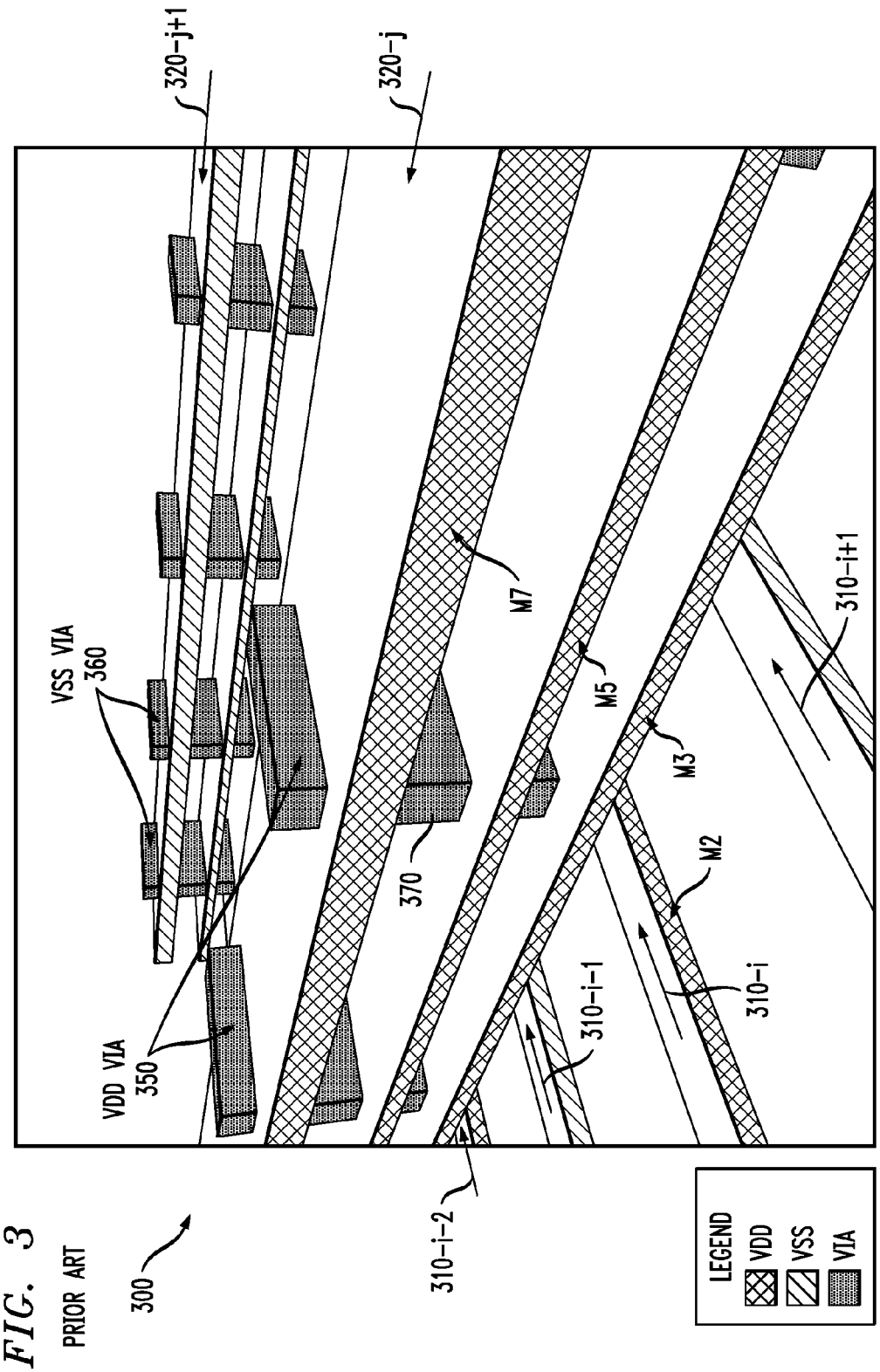
FIG. 3 illustrates another portion of the exemplary conventional power grid of FIG. 1 corresponding to the thin metal levels in further detail.

FIG. 3 illustrates another portion 300 of the exemplary conventional power grid 100 of FIG. 1 corresponding to the thin metal levels in further detail. It is noted that a number of even thin metal layers have been eliminated from FIG. 3 for clarity of illustration. As shown in FIG. 3 for exemplary level M2, the standard cell rows 310 alternate between the $V_{DD}$ power supply voltage and the $V_{SS}$ power supply voltage. Likewise, for the odd levels M3, M5 and M7, the vertical straps 320 alternate between the $V_{DD}$ power supply voltage and the $V_{SS}$ power supply voltage.

In one exemplary implementation of a conventional power grid 100, a number of $V_{DD}$ vias 350 are connected to the $V_{DD}$ power supply voltage through connections to $V_{DD}$ metal traces on the standard cell rows 310 and vertical straps 320. Likewise, a number of $V_{SS}$ vias 360 are connected to the $V_{SS}$ power supply voltage through connections to $V_{SS}$ metal traces on the standard cell rows 310 and vertical straps 320.

As noted above, at a given intersection (or via), such as intersection (via) 370 between a given standard cell row 310-$i$ and a given vertical strap 320-$j$, the via 370 is connected to the same power supply voltage for all thin metal levels M2-M8. In the exemplary embodiment of FIG. 3, the via 370 is connected to the $V_{DD}$ power supply voltage for all thin metal levels M2-M8.

As indicated above, parallel standard cell rows run along the first direction 210 on even thin metal levels (M2, M4, M6 and M8) and parallel vertical straps run along the second direction 220 on odd thin metal levels (M3, M5 and M7). As shown in FIG. 2, conventional techniques employ the same power supply voltage for all thin metal levels M2-M8. For example, conventional techniques can employ a $V_{DD}$ power supply voltage for all exemplary thin metal levels M2-M8. Thus, a given via stack 250 intersects with only one power supply voltage.

Figure 4:
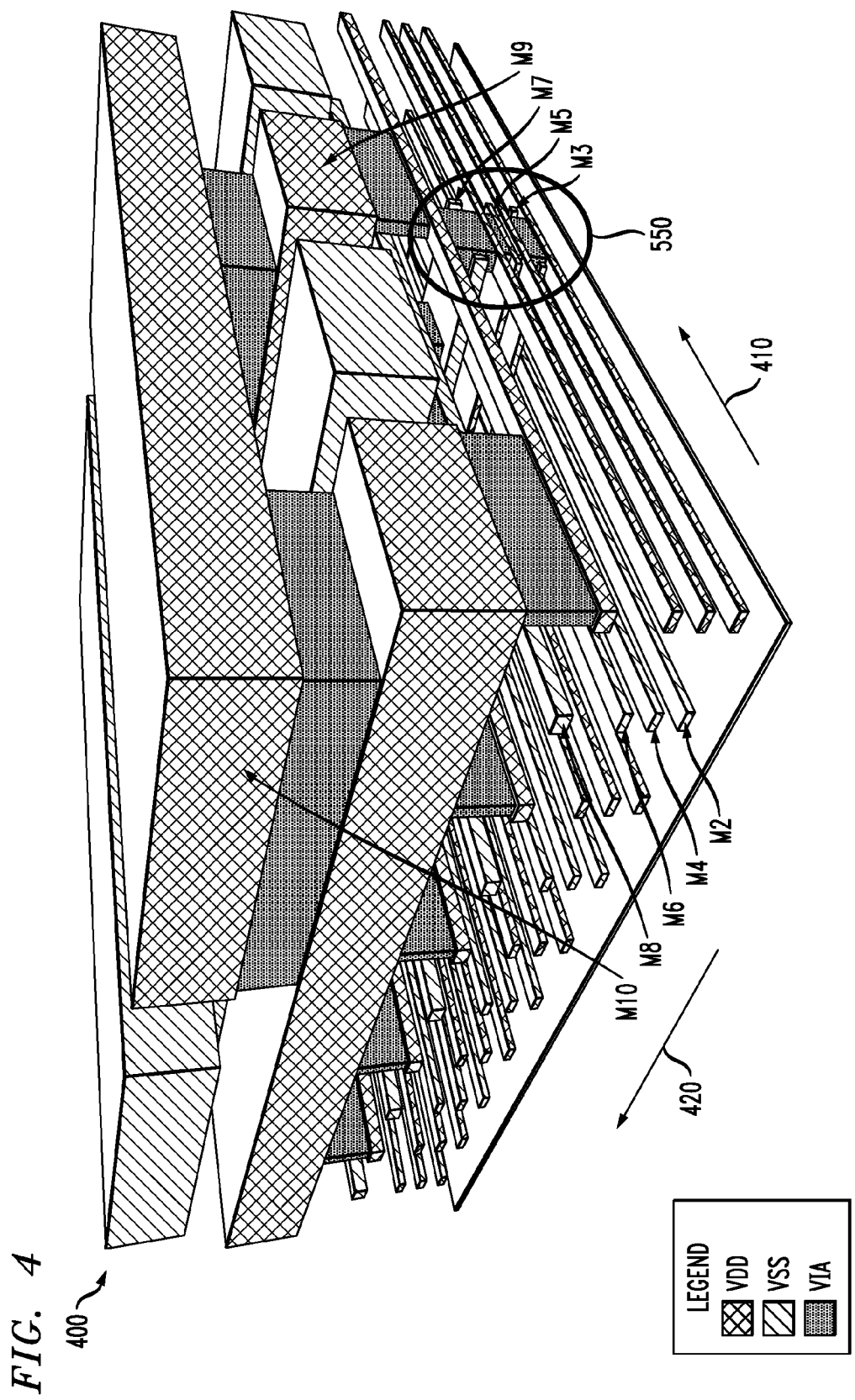
FIG. 4 illustrates a portion of an exemplary power grid for an integrated circuit that incorporates aspects of the present invention.

FIG. 4 illustrates a portion of an exemplary power grid 400 for an integrated circuit that incorporates aspects of the present invention. As shown in FIG. 4, the exemplary power grid 400 comprises a plurality of exemplary metal levels M2 through M10. As previously indicated, exemplary levels M9 and M10 are typically referred to as the thick metal levels and exemplary levels M2-M8 are typically referred to as the thin metal levels. As discussed hereinafter, each metal level M2 through M10 comprises $V_{DD}$ and/or $V_{SS}$ power straps. The various $V_{DD}$ power straps and $V_{SS}$ power straps are distinguished from one another in the figures using different hash patterns, as identified in the Legend portion of each figure. The $V_{DD}$ power straps on the various levels M2 through M10 are connected to the $V_{DD}$ power supply voltage using $V_{DD}$ via stacks, such as via stack 550, as discussed further below in conjunction with FIGS. 5 and 6. Likewise, the $V_{SS}$ power straps on the various levels M2 through M10 are connected to the $V_{SS}$ power supply voltage using $V_{SS}$ via stacks, as discussed further below in conjunction with FIG. 6.

As shown in FIG. 4, the $V_{DD}$ power straps and $V_{SS}$ power straps on levels M9 and M10 are interleaved to create a waffle pattern of $V_{DD}$ and $V_{SS}$ straps. As indicated above, conventional power grids 100 employ the maximum pitch on the thick metal levels, such as levels M9 and M10 for the exemplary conventional power grid 100, that is allowed under the design rules for a given technology. In addition, conventional power grids 100 employ a uniform pitch on all thick metal levels, such as levels M9 and M10 for the exemplary conventional power grid 100.

According to one aspect of the invention, shown in FIG. 4, the bypass capacitance is increased in the thick metal levels of the power grid 400 by decreasing the pitch on at least one thick metal level. As indicated above, the pitch comprises the distance from one edge of a metal trace to the corresponding edge of an adjacent metal trace. This aspect of the present invention recognizes that reducing the pitch increases the number of metal traces having alternating $V_{DD}$ and $V_{SS}$ power supply connections, and thus the number of $V_{DD}$ to $V_{SS}$ transitions, in a given area. In this manner, the area capacitance, $C_A$, and sidewall capacitance, $C_S$, are increased. In one exemplary embodiment, at least one level among the thick metal levels employs a lower pitch than other thick metal levels. For example, as shown in FIG. 4, exemplary level M9 has a lower pitch than level M10. Thus, in the same area, exemplary level M9 has a greater number of alternating metal traces than level M10.

In one embodiment, at least one level among the thick metal levels employs a pitch that is less than the maximum pitch allowed under the design rules for a given technology. In one particular exemplary embodiment, at least one level among the thick metal levels employs a substantial minimum pitch that is allowed under the design rules for a given technology. For an exemplary 28 nm technology from Taiwan Semiconductor Manufacturing Company, a wire width of 0.62 um and a pitch of 2.4 um can be employed on the M9 level and a wire width of 9.6 um and a pitch of 11.8 um can be employed on the M10 level.

The exemplary power grid 400 also comprises a plurality of thin metal levels M2 through M8, as discussed further below in conjunction with FIGS. 5 and 6. In addition, FIG. 4 also illustrates first and second directions 410, 420, respectively, of the exemplary power grid 400. In the notation used herein, parallel standard cell rows run along the first direction 410 on even thin metal levels (M2, M4, M6 and M8) and parallel vertical straps run along the second direction 420 on odd thin metal levels (M3, M5 and M7). The metal traces on the thin metal levels M2-M8 are perpendicular to one another on odd and even levels. A given standard cell row is labeled 410-$i$ and a given vertical strap is labeled 420-$j$.

Figure 5:
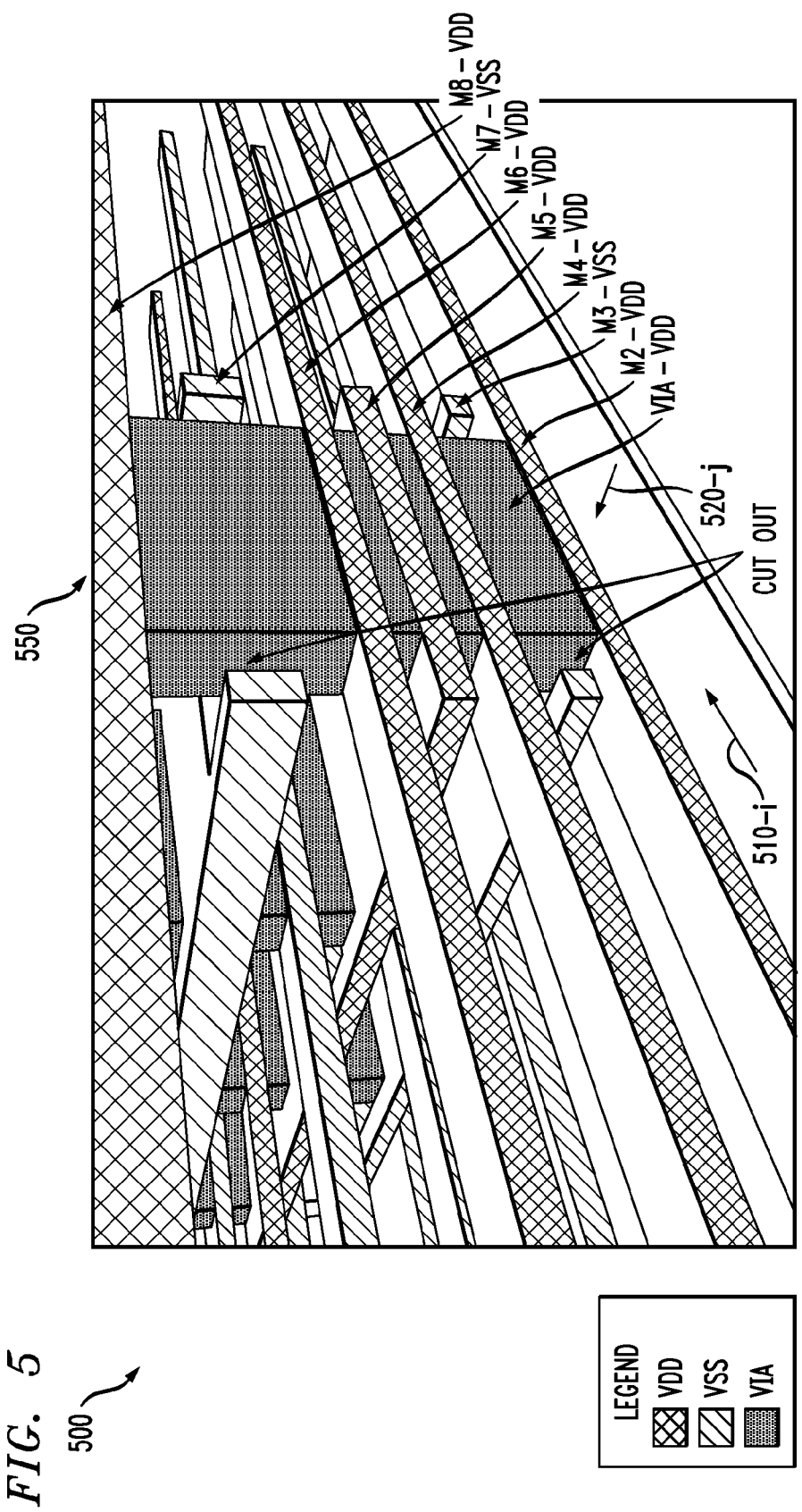
FIG. 5 illustrates a portion of the exemplary power grid of FIG. 4 corresponding to the thin metal levels M2-M8 in further detail.

FIG. 5 illustrates a portion 500 of the exemplary power grid 400 of FIG. 4 corresponding to the thin metal levels M2-M8 in further detail. The illustrated portion 500 shown in FIG. 5 corresponds to a given via stack 550, which is positioned at an intersection between a given standard cell row 510-$i$ and a given vertical strap 520-$j$. As indicated above, parallel standard cell rows run along the first direction 510 on even thin metal levels (M2, M4, M6 and M8) and parallel vertical straps run along the second direction 520 on odd thin metal levels (M3, M5 and M7). In addition, on each thin metal level, the metal traces alternate with $V_{DD}$ power straps and $V_{SS}$ power straps, as discussed further below in conjunction with FIG. 6. As indicated above, conventional techniques employ the same power supply voltage at a given intersection (via) of a given standard cell row and a given vertical strap for all thin metal levels M2-M8.

According to an aspect of the invention, bypass capacitance is increased in the thin metal levels of the power grid by employing a different power supply voltage at a given intersection (via) of a given standard cell row and a given vertical strap for at least one level among the thin metal levels than the other thin metal levels. This aspect of the present invention recognizes that employing a different power supply voltage for at least one thin metal level at a given intersection increases the number of $V_{DD}$ to $V_{SS}$ transitions in the vertical direction in a given area, thereby increasing the area capacitance, $C_A$.

For example, as shown in FIG. 5, the even metal levels M2, M4, M6, M8 that are adjacent a given intersection (via), such as exemplary via 550, have a first power supply voltage, such as $V_{DD}$. In addition, at least one of the exemplary odd metal levels M3, M5, M7 that are adjacent a given intersection (via), such as exemplary via 550, have a different or second power supply voltage, such as $V_{SS}$. For example, in the embodiment shown in FIG. 5, levels M3 and M7 have the different or second power supply voltage, such as $V_{SS}$. The different power supply voltage for at least one thin metal level at a given intersection increases the number of $V_{DD}$ to $V_{SS}$ transitions in the vertical direction in a given area, thereby increasing the area capacitance, $C_A$. In the exemplary embodiment shown in FIG. 5, there are four $V_{DD}$ to $V_{SS}$ transitions (or vice versa) in the vertical direction in the given area around via 550.

It is noted that the two vias (not shown in FIG. 5) that are adjacent to via stack 550 in each direction along the standard cell row 510-$i$ will have the opposite power supply voltages on each thin metal level, relative to the power supply voltages on each thin metal level associated with via stack 550, as discussed further below in conjunction with FIG. 6. For example, if the even metal levels M2, M4, M6, M8 around via 550 have a first power supply voltage, such as $V_{DD}$, and odd level M5 has the same first power supply voltage, such as $V_{DD}$, and two odd levels M3 and M7 have the different or second power supply voltage, such as $V_{SS}$, then the even metal levels M2, M4, M6, M8 around the adjacent vias (in the 110 direction of FIG. 1) will have the second power supply voltage, such as $V_{SS}$, and odd level M5 has the same second power supply voltage, such as $V_{SS}$, and the two odd levels M3 and M7 have the different or first power supply voltage, such as $V_{DD}$.

In addition, as discussed further below in conjunction with FIG. 6, since the alternate power supply can be in the vicinity of a via, a further aspect of the invention provides cutouts in the metal traces having the alternate power supply to the via power supply, around the via, in order to prevent a short circuit between the two power supply voltages.

Figure 6:
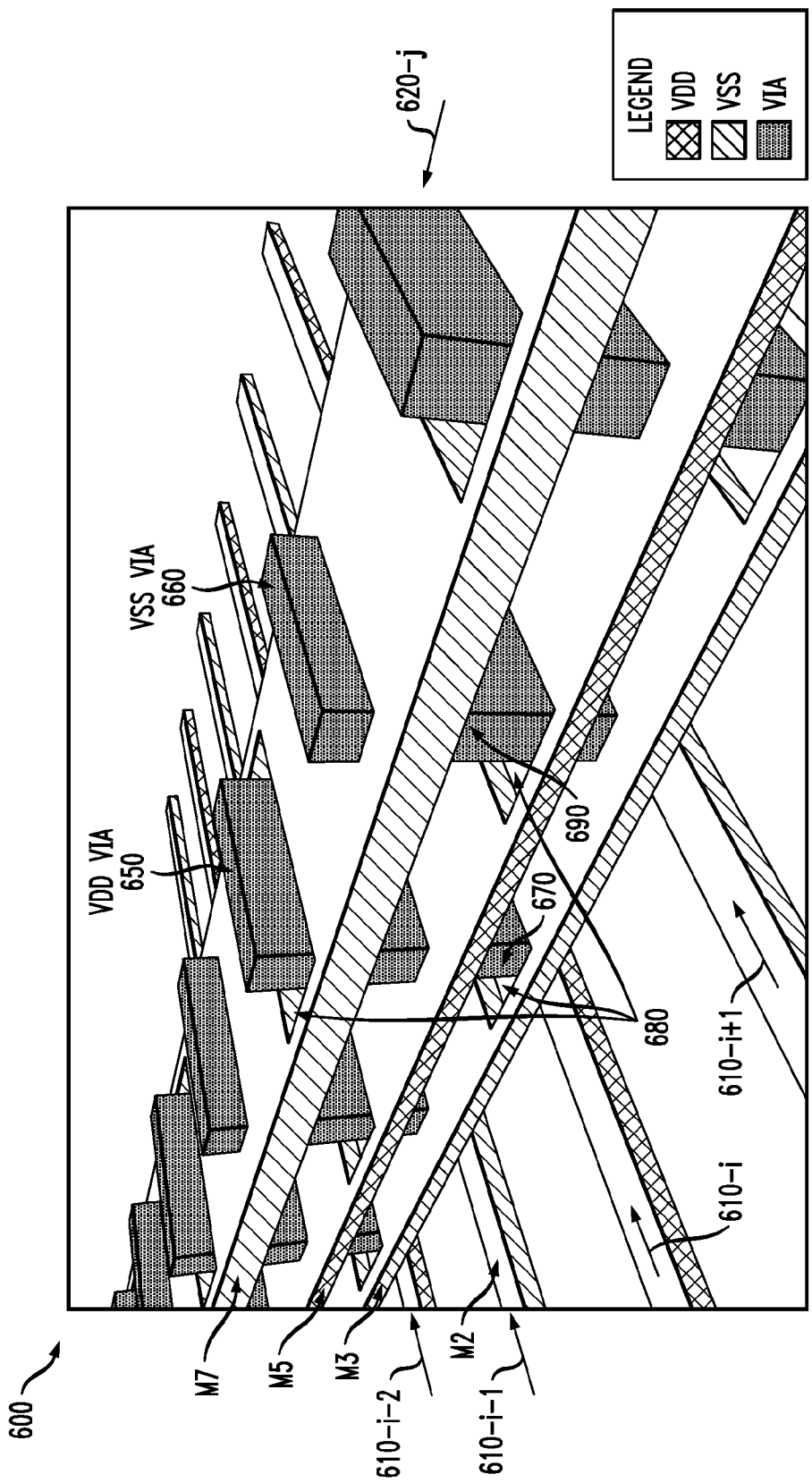
FIG. 6 illustrates another portion of the exemplary power grid of FIG. 4 corresponding to the thin metal levels in further detail.

FIG. 6 illustrates another portion 600 of the exemplary power grid 400 of FIG. 4 corresponding to the thin metal levels in further detail. It is noted that a number of even thin metal layers have been eliminated from FIG. 6 for clarity of illustration. As shown in FIG. 6 for exemplary level M2, the standard cell rows 610 alternate between the $V_{DD}$ power supply voltage and the $V_{SS}$ power supply voltage. Likewise, for the odd levels M3, M5 and M7, the vertical straps 620 alternate between the $V_{DD}$ power supply voltage and the $V_{SS}$ power supply voltage.

In one exemplary implementation of a power grid 400, a number of $V_{DD}$ vias 650 are connected to the $V_{DD}$ power supply voltage through connections to $V_{DD}$ metal traces on the standard cell rows 610 and vertical straps 620. Likewise, a number of $V_{SS}$ vias 660 are connected to the $V_{SS}$ power supply voltage through connections to $V_{SS}$ metal traces on the standard cell rows 610 and vertical straps 620.

At a given intersection (or via), such as intersection (via) 670 between a given standard cell row 610-$i$ and a given vertical strap 6-$j$, the via 670, a different power supply voltage is employed for at least one level among the thin metal levels relative to the other thin metal levels. For example, as shown in FIG. 6, the even metal level M2 (as well as levels M4, M6, M8 that are not shown in FIG. 6) that are adjacent exemplary intersection or via 670, have a first power supply voltage. $V_{DD}$. In addition, at least one of the exemplary odd metal levels M3, M5, M7 that are adjacent exemplary intersection or via 670, have a different or second power supply voltage, $V_{SS}$. For example, in the embodiment shown in FIG. 6, levels M3 and M7 have the second power supply voltage, $V_{SS}$. The different power supply voltage for at least one thin metal level at a given intersection increases the number of $V_{DD}$ to $V_{SS}$ transitions in the vertical direction in a given area, thereby increasing the area capacitance. $C_A$, and the sidewall capacitance, $C_S$. In the exemplary embodiment shown in FIG. 6, there are four $V_{DD}$ to $V_{SS}$ transitions (or vice versa) in the vertical direction in the given area around via 670.

In addition, as shown in FIG. 6, an aspect of the invention provides cutouts 680 in the metal traces having the alternate power supply to the via power supply, around the via, in order to prevent a short circuit between the two power supply voltages. For example, there are cutouts 680 in the $V_{SS}$ metal traces around the exemplary $V_{DD}$ via 670. Likewise, there are cutouts 680 in the $V_{DD}$ metal traces around the exemplary $V_{SS}$ via 690.

Figure 7:
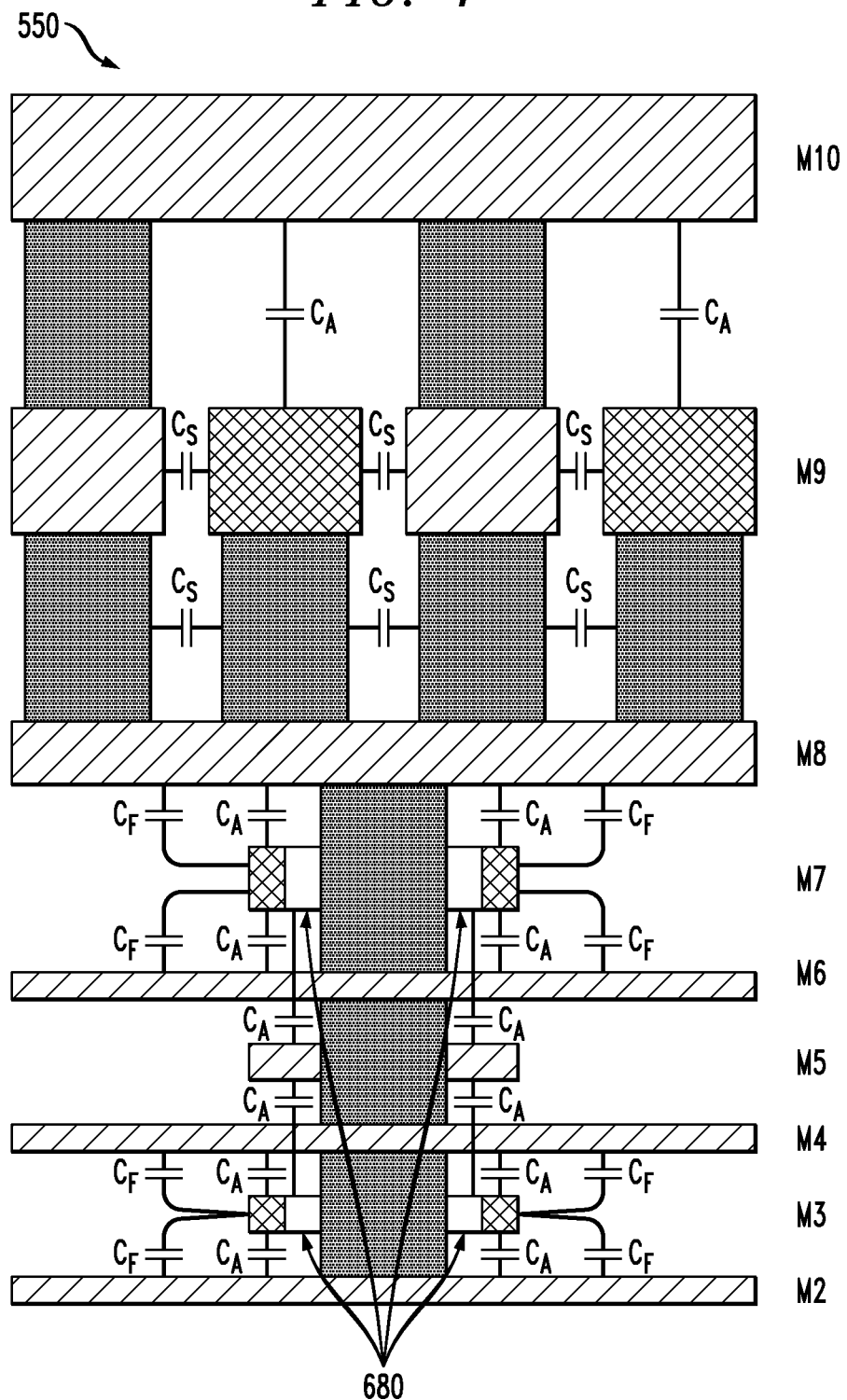

FIG. 7 is a cross sectional view of the exemplary via 550 along the line 520-$i$ of FIG. 5. FIG. 7 illustrates the various capacitances that are created in the thick metal levels and thin metal levels, due to various aspects of the present invention.

As indicated above, bypass capacitance comprises one or more of area capacitance, $C_A$, fringe capacitance, $C_F$, and sidewall capacitance, $C_S$. FIG. 7 illustrates the additional capacitance that results from the reduced pitch in exemplary thick metal level M9, relative to exemplary thick metal level M10. In addition, FIG. 7 illustrates the additional capacitance that results from the additional $V_{DD}$ to $V_{SS}$ transitions (and vice versa) in the thin metal levels M2-M8. It is noted that the additional capacitance component obtained from the cutouts 680 is omitted, for ease of illustration.

FIG. 8 is a cross sectional view of the exemplary via 550 along the line 510-$i$ of FIG. 5. FIG. 8 illustrates the various capacitances that are created in the thick metal levels and thin metal levels, due to various aspects of the present invention. FIG. 8 illustrates the additional capacitance that results from the reduced pitch in exemplary thick metal level M10, relative to exemplary thick metal level M9. In addition, FIG. 8 illustrates the additional capacitance that results from the additional $V_{DD}$ to $V_{SS}$ transitions (and vice versa) in the thin metal levels M2-M8. It is noted that the additional capacitance component obtained from the cutouts 680 is omitted, for ease of illustration.

The exemplary power grid 400 incorporates one or more aspects of the invention to increase the bypass capacitance by increasing one or more of the area capacitance, $C_A$, fringe capacitance, $C_F$, and sidewall capacitance, $C_S$. In addition, the exemplary power grid 400 increases available routing resources in the M3, M5 and M7 layers. In a conventional power grid 100, there is a $V_{DD}$ stack of M3, M5 and M7 followed by a $V_{SS}$ stack of M3, M5 and M7. The exemplary power grid 400 merges the $V_{DD}$ and $V_{SS}$ power supplies into one stack. Thus, the other stack can be eliminated freeing up routing resources.

Among other benefits, the disclosed exemplary techniques do not require additional surface area, while also employing a low ESR bypass capacitor with substantially no leakage power.

At least a portion of the techniques of the present invention may be implemented in one or more ICs. In forming ICs, die are typically fabricated in a repeated pattern on a surface of a semiconductor wafer. Each of the die includes a stripline device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An IC in accordance with the present invention can be employed in many application and/or electronic systems. Suitable systems for implementing the invention may include, but are not limited to, communication devices and devices for distributing cable television signals and other high speed signals. Systems incorporating such integrated circuits are considered part of this invention. Given the teachings of the invention provided herein, one of ordinary skill in the art will be able to contemplate other implementations and applications of the techniques of the invention.

Methods may be utilized to form an integrated circuit incorporating aspects of the present invention. The integrated circuit design can be created in a graphical computer programming language, and can be stored in a computer storage medium (such as a disk, tape, physical hard drive, or virtual hard drive such as in a storage access network). The stored design can be converted into the appropriate format (e.g., Graphic Design System II (GDSII)) for the fabrication of photolithographic masks, which typically include multiple copies of the integrated circuit design that are formed on a wafer. The photolithographic masks are utilized to define areas of the wafer (and/or the layers thereon) to be etched or otherwise processed.

The resulting integrated circuits may be distributed by the fabricator in raw wafer form (i.e., as a single wafer that has multiple unpackaged integrated circuits), as a bare die, or in packaged form. In the latter case, the integrated circuit is mounted in a single integrated circuit package (e.g., plastic carrier with leads that are affixed to a motherboard or other higher level carrier) or in a multi-integrated circuit package (e.g., ceramic carrier that has either or both surface interconnections or buried interconnections). In any case, the integrated circuit can be integrated with other chips, discrete circuit elements, and/or other signal processing devices as part of either an intermediate product (e.g., motherboard) or an end product. The end product may be any product that includes integrated circuits.

It is to be understood that the embodiments and variations shown and described herein are merely illustrative of the principles of this invention and that various modifications may be implemented by those skilled in the art without departing from the scope and spirit of the invention.

We claim:

1. A power grid for an integrated circuit, comprising:
a plurality of thick metal layers having a plurality of metal traces; and
at least one thin metal layer,
wherein the plurality of thick metal layers having the plurality of metal traces are configured to route power supplies, wherein at least one of said thick metal layers has a lower pitch than a pitch on another thick metal layer of the plurality of thick metal layers, and wherein said lower pitch increases one or more of a bypass capacitance of said power grid and a number of transitions between at least two power supply levels in a given area.

2. The power grid of claim 1, wherein said integrated circuit is fabricated utilizing a given integrated circuit fabrication technology, wherein said given integrated circuit fabrication technology supports fabrication of a pitch equal to or greater than a substantial minimum pitch on a thick metal layer, and wherein said lower pitch of said at least one of said thick metal layers comprises said substantial minimum pitch.

3. The power grid of claim 1, wherein said at least one thick metal layer has a lower pitch than one or more additional thick metal layers.

4. The power grid of claim 1, wherein said pitch comprises a distance from one edge of a given metal trace to a corresponding edge of an adjacent metal trace.

5. A power grid for an integrated circuit, comprising:
a plurality of thin metal layers having a plurality of metal traces, wherein a plurality of said metal traces on different thin metal layers are connected by at least one via, wherein said at least one via is substantially surrounded by a metal trace on at least one thin metal level connected to a different power supply voltage than a power supply of one or more additional thin metal levels.

6. The power grid of claim 5, wherein said via is positioned at an intersection of a given standard cell row and a given vertical strap.

7. The power grid of claim 5, wherein said different power supply voltage for said surrounding metal trace increases a number of $V_{DD}$ to $V_{ss}$ transitions in a given area.

8. The power grid of claim 5, wherein said different power supply voltage for said surrounding metal trace increases an area capacitance, $C_A$, of said power grid.

9. The power grid of claim 5, further comprising a cutout of said surrounding metal trace.

10. The power grid of claim 9, wherein said cutout is in said metal trace having an alternate power supply to a power supply voltage of said via.

11. The power grid of claim 9, wherein said cutout prevents a short circuit between two power supply voltages.

12. The power grid of claim 9, wherein said cutout increases one or more of a fringe capacitance, $C_F$, and a sidewall capacitance, $C_S$, of said power grid.

13. An integrated circuit comprising:
a power grid comprising a plurality of thick metal layers having a plurality of metal traces and at least one thin metal layer, wherein the plurality of thick metal layers having the plurality of metal traces are configured to route power supplies, wherein at least one of said thick metal layers has a lower pitch than a pitch on another thick metal layer of the plurality of thick metal layers, and wherein said lower pitch increases one or more of a bypass capacitance of said power grid and a number of transitions between at least two power supply levels in a given area.

14. The integrated circuit of claim 13, wherein said integrated circuit is fabricated utilizing a given integrated circuit fabrication technology, wherein said given integrated circuit fabrication technology supports fabrication of a pitch equal to or greater than a substantial minimum pitch on a thick metal layer, and wherein said lower pitch of said at least one of said thick metal layers comprises said substantial minimum pitch.

15. The integrated circuit of claim 13, wherein said at least one thick metal layer has a lower pitch than one or more additional thick metal layers.

16. An integrated circuit comprising:
a power grid comprising a plurality of thin metal layers having a plurality of metal traces, wherein a plurality of said metal traces on different thin metal layers are connected by at least one via, wherein said at least one via is substantially surrounded by a metal trace on at least one thin metal level connected to a different power supply voltage than a power supply of one or more additional thin metal levels.

17. The integrated circuit of claim 16, wherein said via is positioned at an intersection of a given standard cell row and a given vertical strap.

18. The integrated circuit of claim 16, wherein said different power supply voltage for said surrounding metal trace increases a number of $V_{DD}$ to $V_{ss}$ transitions in a given area.

19. The integrated circuit of claim 16, wherein said different power supply voltage for said surrounding metal trace increases an area capacitance, $C_A$, of said power grid.

20. The integrated circuit of claim 16, further comprising a cutout of said surrounding metal trace that prevents a short circuit between two power supply voltages.

21. The integrated circuit of claim 20, wherein said cutout is in said metal trace having an alternate power supply to a power supply voltage of said via.

22. The integrated circuit of claim 20, wherein said cutout increases one or more of a fringe capacitance, $C_F$, and a sidewall capacitance, $C_S$, of said power grid.

* * * * *